United States Patent [19]
Hayashi

[11] Patent Number: 5,392,040
[45] Date of Patent: Feb. 21, 1995

[54] BIT COMPRESSION CIRCUIT USED FOR A DELTA SIGMA TYPE DIGITAL-TO-ANALOG CONVERTER

[75] Inventor: Koji Hayashi, Hashima, Japan

[73] Assignee: Sanyo Electric Co., Ltd., Osaka, Japan

[21] Appl. No.: 21,183

[22] Filed: Feb. 23, 1993

[30] Foreign Application Priority Data

Feb. 24, 1992 [JP] Japan .................................. 4-36441
Feb. 26, 1992 [JP] Japan .................................. 4-39504

[51] Int. Cl.⁶ .............................................. H03M 3/02
[52] U.S. Cl. ...................................... 341/143; 341/144
[58] Field of Search ............... 341/143, 118, 145, 144, 341/146

[56] References Cited
U.S. PATENT DOCUMENTS 5,068,661 11/1991 Kaneaki et al. ................. 341/143

OTHER PUBLICATIONS

"Oversampled, Linear Predictive and Noise-Shaping Coders of Order N 1", *IEEE Transactions on Circuits and Systems*, vol. CAS-25, No. 7, Jul. 1978, Stuart K. Tewksbury, et al., pp. 436–447.

*Primary Examiner*—Brian K. Young
*Attorney, Agent, or Firm*—Spensley Horn Jubas & Lubitz

[57] ABSTRACT

A quantization circuit samples input digital data represented by a predetermined number of bits fed during a given period on a sampling period shorter than the digital data input period and converts the sampled data into quantized digital data having a fewer number of bits than the input digital data. Quantization noise at the quantization circuit is fed back into an input side of the quantization circuit to form a noise shaping loop. The noise shaping loop is provided with an auxiliary loop containing an integrator, and the integrating result is selectively added. Then, the noise shaping loop degree can be changed by determining whether or not the integrating result is to be added. An infinite impulse response filter is located on a feedback loop of the noise shaping loop for averaging noise, thereby improving the noise removing performance without raising the noise shaping loop degree.

11 Claims, 4 Drawing Sheets

BIT COMPRESSION CIRCUIT USED FOR A DELTA SIGMA TYPE DIGITAL-TO-ANALOG CONVERTER

BACKGROUND OF THE INVENTION

1. Field of the Invention

This invention relates to a bit compression circuit used for a delta sigma type digital-to-analog converter (D/A converter) applicable to audio apparatus, etc., for providing high conversion accuracy by oversampling.

2. Description of the Related Art

With digital audio apparatus such as a compact disk player, analog sound is sampled at a predetermined frequency for recording as digital data of an appropriate number of bits. In a play mode, digital data read from record media such as a compact disk is restored to analog signals by a D/A converter for reproducing sound as sound signals through an amplifier and a loudspeaker. In the play mode, it is desired to minimize a D/A conversion error for inhibiting distortion of regenerative signals. Various D/A conversion systems have been designed for providing high conversion accuracy to meet this demand.

FIG. 1 is a schematic block diagram of a delta sigma ($\Delta\Sigma$)type D/A converter.

A bit compression circuit 1 receives, for example, 16-bit digital data DG1 and converts it into 3-bit digital data DG2 for output. In the data conversion, the bit compression circuit 1 oversamples the digital data DG1 at a frequency (48 fs) provided by multiplying a sampling frequency fs by 48, and again quantizes at seven stages of $\pm 3$ ($-3, -2, \ldots, 0, \ldots +3$) so as to provide the 3-bit digital data DG2. At this time, quantization noise, namely, an error of the digital data DG2 compared to the digital data DG1 is biased to the high frequency band side by a so-called noise shaping loop for feeding back an error incurred at the conversion steps in sequence into the input digital data DG1. Thus, quantization noise in a low frequency band is reduced drastically, and most of the quantization noise is ignored by passing data through a low-pass filter. To feed back the quantization noise at the frequency 48 fs, an adder which adds the fed-back quantization noise also operates at 48 fs and the output data frequency of the bit compression circuit 1 also becomes 48 fs.

When digital data DG2 of three bits is input to a pulse width modulation circuit 2, eight clocks are set as the data conversion time to convert a 3-bit data piece. The 3-bit data value determines which of seven "1" signals are active during the eight clock cycles period, in relation to the 3 bit value. For example, if the 3-bit data value is 3, "1" signals are output for the first 3-clock periods within the eight clocks. That is, "1" signals are output for the period of as many clocks as the value of digital data DG2 and "0" signals are output for the remaining period within eight clocks. A sequence of eight 1-bit digital data DG3 pieces (a sequence of eight signals of "1" and "0") is provided corresponding to the digital data DG2. The digital data DG3 is passed through the analog low-pass filter 3 made up of an RC circuit, etc., to remove the high frequency component, and is then output to the next-stage circuit as an analog signal AN having a level corresponding to the input digital signal value. If a time constant at the analog low-pass filter 3 is made small, preferably the pulse width modulation circuit 2 outputs "1" and "0" signals alternately in order to output DC signals at a predetermined level.

FIG. 2 is a block diagram showing the configuration of the bit compression circuit 1 adopting a quadratic noise shaping loop.

A quantization circuit 4 evaluates signal levels indicated by 16-bit digital data DG1 at seven stages of $\pm 3$, and outputs 3-bit digital data DG2 corresponding to them. Input data and output data of the quantization circuit 4 are fed into an adder 5 where the data output from the quantization circuit 4 is subtracted from the data input to the quantization circuit 4 for calculation of data representing quantization noise. This quantization noise representation data is fed into a delay circuit 6 for a delay as long as one sampling period before it is input to a second delay circuit 7 and a multiplier 8. Then, the output of the delay circuit 7 is fed into an adder 9 for subtraction from digital data DG1, and the output of the multiplier 8 where a multiplication factor is set to 2 is fed into an adder 10 which then adds it to output of the adder 9. Output of the adder 10 is fed into the quantization circuit 4.

Assuming that the digital data DG1 and DG2 are X and Y, that outputs of the adders 10 and 9 are A and B, and that quantization noise at the quantization circuit 4 is N, output of the adder 5 becomes $-N$ and a unit delay is represented by a complex number $Z^{-1}$ in Z conversion. Therefore, the following three expressions are true:

$$Y = A + N$$

$$B - 2N \times Z^{-1} = A$$

$$X + N \times Z^{-2} = B$$

When A and B are eliminated from these expressions, the output Y with respect to the input X becomes $$Y = X + N \times (1 - Z^{-1})^2$$

This indicates a quadratic noise shaping operation.

In contrast, a bit compression circuit adopting a cubic noise shaping loop contains a delay circuit 11, a multiplier 12, and an adder 13 which are added to the input side of a bit compression circuit forming a quadratic noise shaping loop, as shown in FIG. 3. Output of a delay circuit 7 is fed into the delay circuit 11 and the multiplier 12. Output of the delay circuit 11 is fed into the adder 13 which then adds it to digital data DG1. Output of the multiplier 12 is fed into an adder 9 for subtraction from output of the adder 13. Multiplication factor of both multipliers 8 and 12 is set to "3".

Assuming that the output of the adder 13 is C, the following four expressions are true:

$$Y = A + N$$

$$B - 3N \times Z^{-1} = A$$

$$C + 3N \times Z^{-2} = B$$

$$X - N \times Z^{-3} = C$$

as in the circuit shown in FIG. 2. Eliminating A, B, and C from these expressions results in $$Y = X + N \times (1 - Z^{-1})^3$$

This indicates a cubic noise shaping operation.

FIG. 4 shows a bit compression circuit adopting a linear noise shaping loop. As shown in the figure, the delay circuit 7, the multiplier 8, and the adder 9 shown in FIG. 2 are omitted. The bit compression circuit accomplishes a linear noise shaping operation of $$Y=X+N\times(1-Z^{-1})$$

For the characteristics of a noise shaping loop of degree n represented by $Y=X+N\times(1-Z^{-1})^n$, the higher the noise shaping degree, the less the noise constituent because normally $|Z^{-1}|$ is smaller than 1. However, since a noise shaping loop of a high degree increases in the bias of the noise constituent toward a high frequency band, a sharp characteristic is required for the low-pass filter 3 to remove noise in the high frequency band. Therefore, the noise shaping loop degree is set high for the purpose of inhibiting noise in a low frequency band; it is set low for the purpose of inhibiting noise in a high frequency band.

Then, there is a demand to change the noise shaping loop degree according to applications. However, a delta sigma type D/A converter for which the noise shaping loop degree is set at the circuit design stage has a fixed conversion characteristic and is applicable to limited applications, thus lacks versatility and is high in cost.

If the number of bits of digital data DG2 output from the quantization circuit 4 is increased, quantization noise at the quantization circuit 4 is decreased and noise can be reduced without making the noise shaping loop degree high. However, as the number of bits of output data of the quantization circuit 4 increases, high speed operation is required for the pulse width modulation circuit 2 where as many clocks as the number of quantization steps must be set within one sampling period. If data consists of three bits, eight clocks are required; if it consists of four bits, 16 clocks are required. As a result, the D/A converter depends on how fast the circuit components operate.

SUMMARY OF THE INVENTION

Accordingly, it is an object of the invention to enable various noise shaping loop degrees to be set for changing the conversion characteristics of a delta sigma type D/A converter according to applications.

Another object of the invention is to reduce noise of a delta sigma type D/A converter with the noise shaping loop degree set low independently of the circuit operation speed limits.

To these ends, according to a first embodiment of the invention, there is provided a bit compression circuit for decreasing the number of bits of digital data used for a delta sigma type D/A converter which converts input digital data into analog signals, the bit compression circuit comprising:

- a quantization circuit which samples input digital data represented by a predetermined number of bits fed during a given period on a sampling period shorter than the digital data input period and converts the sampled data into quantized digital data having a fewer number of bits than the input digital data;
- a first adder for calculating quantization noise data generated during quantization from the difference between the input data and output data of the quantization circuit;
- a first delay circuit which delays the quantization noise data output by the first adder for the sampling period for outputting delayed quantization noise data;
- a second adder which adds the quantization noise data delayed for the sampling period which is output by the delay circuit and digital data fed into the quantization circuit;
- an integrator into which the delayed quantization noise data is fed for integrating the same; and
- selective addition means for selectively adding the output of the integrator to data fed into the quantization circuit.

An auxiliary loop containing the integrator is provided and whether or not the integrating result is to be added can be determined by the selective addition means. Thus, the auxiliary loop can be selectively operated in response to signals such as a mode setting signal given from an external circuit or device for changing the noise shaping loop degree without altering the circuit configuration.

Assuming that input data, output data, quantization noise, and unit delay are X, Y, N, and $Z^{-1}$ respectively, a noise shaping loop represented by $$Y=X+N(1-Z^{-1})^1 \text{ OR } 2$$

can be formed.

The selective addition means comprises:
- a third adder disposed on an output side of the quantization circuit; and
- selection means for determining whether or not the output from the integrator is to be fed into the third adder.

The selection means is a switch for selecting the output from the integrator or a "0" signal for output.

The configuration enables easy determination as to whether or not output of the integrator is to be added.

The integrator comprises an adder for the integrator into which the delayed quantization noise data is fed, and a delay circuit for the integrator for delaying output of the adder for the integrator for the sampling period and feeding it back into the adder for the integrator.

The bit compression circuit further includes:
- a first multiplier for multiplying the delayed quantization noise data supplied to the second adder by a predetermined coefficient;
- an additional delay circuit for further delaying the delayed quantization noise data for the sampling period; and
- an additional adder for subtracting output from the additional delay circuit from the input digital data.

Thus, a noise shaping loop of degree (2+1) can be formed. That is, a noise shaping loop represented by $$Y=X+N(1-Z^{-1})^2 \text{ OR } 3$$

can be formed.

Further, a noise shaping loop of a high degree represented by $$Y=X+N(1-Z^{-1})^n \text{ OR } n+1 \text{ (n=integer of 3 or greater)}$$

may also be formed.

According to a second embodiment of the invention, there is provided a bit compression circuit used for a delta sigma type D/A converter which converts input digital data into analog signals, the bit compression circuit comprising:

a quantization circuit which samples input digital data represented by a predetermined number of bits fed during a given period on a sampling period shorter than the digital data input period and converts the sampled data into quantized digital data having a fewer number of bits than the input digital data;

a first delay circuit which delays the quantized digital data output by the quantization circuit for the sampling period for outputting delayed quantized data;

a first adder disposed on an input path to the quantization circuit for subtracting the delayed quantized data from input digital data;

a first integrator disposed between the first adder and the quantization circuit for integrating the output of the first adder and supplying the result to the quantization circuit;

a second adder disposed on an input side of the first adder for subtracting the delayed quantized data from input data;

a second integrator disposed between the second adder and the first adder for integrating output of the second adder and supplying the result to the first adder;

first selection means disposed on an input path of the quantized data to the second adder for controlling supply of the quantized data to the second adder; and second selection means for controlling integrating operation of the second integrator, the selection means for determining whether or not the integrating result output from the second integrator is to be supplied to the first adder, input data of the second integrator being supplied to the first adder as it is if the integrating result is not supplied to the first adder.

This configuration also enables a noise shaping loop of degree (1+1).

Assuming that input data, output data, quantization noise, and unit delay are X, Y, N, and $Z^{-1}$ respectively, a noise shaping loop represented by $$Y = X + N(1-Z^{-1})^{1 \ OR \ 2}$$

can be formed.

The first selection means is a switch for selecting the delayed quantized data or "0" for output, and the second selection means is a switch disposed on a bypass of the second integrator.

Further, a third adder is disposed between the second integrator and the first adder for subtracting the delayed quantized data from output data of the first adder, and a third integrator is disposed between the third adder and the first adder for integrating the output of the third adder and supplying the result to the first adder.

According to a third embodiment of the invention, there is provided a bit compression circuit used for a delta sigma type D/A converter which converts input digital data into analog signals, the bit compression circuit comprising:

a quantization circuit which samples input digital data represented by a predetermined number of bits fed during a given period on a sampling period shorter than the digital data input period and converts the sampled data into quantized digital data having a fewer number of bits than the input digital data;

a first adder for calculating quantization noise data generated during quantization from the difference between the input data and output data of the quantization circuit;

an infinite impulse response filter for filtering the quantization noise data output by the first adder; and a second adder which adds the output of the infinite impulse response filter to data input to the quantization circuit.

In the embodiment, noise data representing quantization noise at the quantization circuit is fed back into the input side of the quantization circuit through the infinite impulse response filter. Thus, the noise data is averaged over sampling periods and the noise data fed back through the infinite impulse response filter is lessened. Then, noise from a low frequency band to a high frequency band can be suppressed without raising the noise shaping loop degree.

Assuming that input data, output data, quantization noise, and unit delay are X, Y, N, and $Z^{-1}$ respectively, a noise shaping loop represented by $$Y = X + N(1-Z^{-1})(1+Z^{-1}/2)^{-1}$$

can be formed.

The infinite impulse response filter comprises:

a third adder into which the quantization noise data is fed from the first adder;

a first delay circuit which delays the output of the third adder for the sampling period;

a first multiplier which multiplies the output of the first delay circuit by a predetermined coefficient for feeding back the result into the third adder;

a second multiplier which multiplies the output of the third adder by a predetermined coefficient;

a third multiplier which multiplies the output of the first delay circuit by a predetermined coefficient; and a fourth adder which adds the output of the second multiplier and the output of the third multiplier.

The infinite impulse response filter further includes:

a second delay circuit into which the output of the first delay circuit is fed for further delaying it for the sampling period;

fourth and fifth multipliers, each of which multiplies the output of the second delay circuit by a predetermined coefficient;

fifth adder disposed between the first multiplier and the third adder for adding the output of the first multiplier and the output of the fourth multiplier; and sixth adder disposed between the third multiplier and the fourth adder for adding the output of the third multiplier and the output of the fifth multiplier.

Thus, a noise shaping loop represented by $$Y = X + N(1-Z^{-1})^2(1+Z^{-2}/2+Z^{-2}/4)^{-1}$$

can be formed.

Further, a noise shaping loop of a higher degree may also be formed.

DESCRIPTION OF THE PREFERRED EMBODIMENTS

Embodiment 1-1

Figure 1:
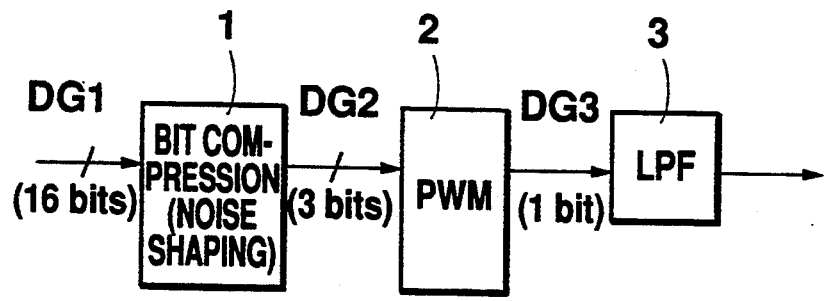
FIG. 1 is a block diagram of a conventional delta sigma type D/A converter.
Figure 2:
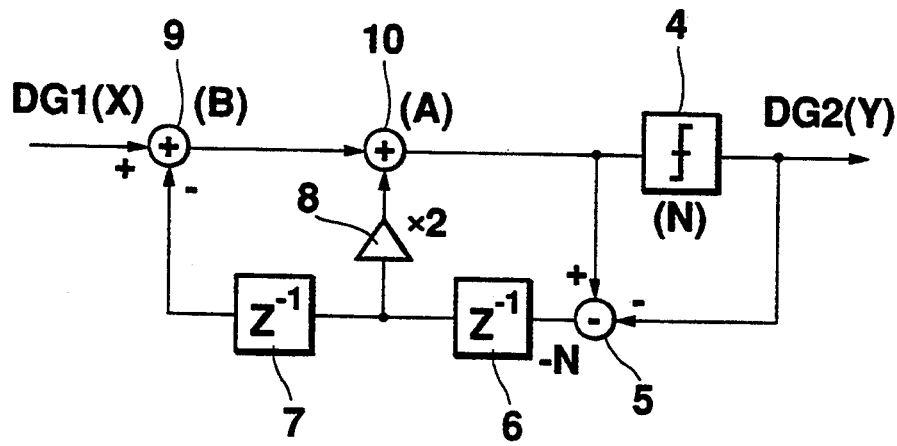
FIG. 2 is a circuit diagram of a bit compression circuit adopting a quadratic noise shaping loop.
Figure 3:
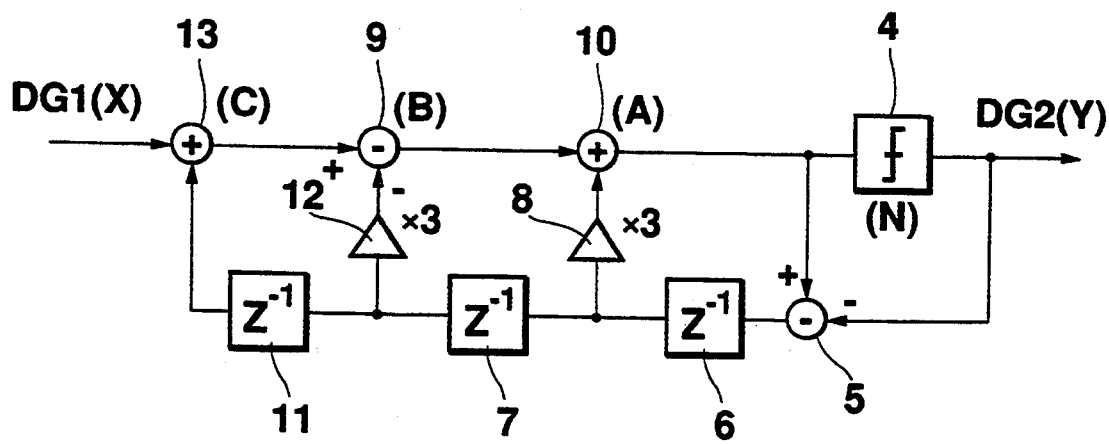
FIG. 3 is a circuit diagram of a bit compression circuit adopting a cubic noise shaping loop.
Figure 5:
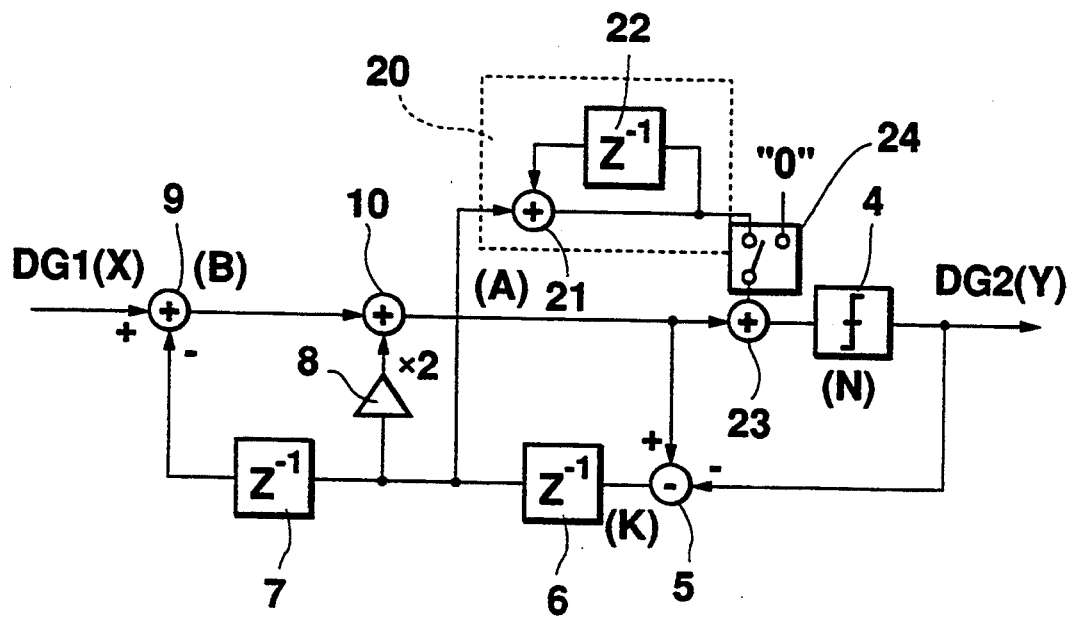
FIG. 5 is a circuit diagram of a bit compression circuit of a delta sigma D/A converter according to an embodiment 1-1 of the invention.

FIG. 5 shows a circuit diagram of a bit compression circuit adopting a noise shaping loop of degree (2+1) for use with a delta sigma type D/A converter of the invention, wherein adders 5, 9, and 10, delay circuits 6 and 7, and a multiplier 8 are the same as those in FIG. 2. Quantization noise data provided by subtracting output data from input data of a quantization circuit 4 is fed into the delay circuit 6 and output of the delay circuit 6 is subtracted from digital data DG1 through the delay circuit 7 and is added to output of the adder 9 through the multiplier 8 to make up a quadratic noise shaping loop. The circuit operates at a frequency which is 48 times as high as that of input digital data. The bit compression circuit is followed by a PWM circuit and a low-pass filter, as shown in FIG. 1, for accomplishing predetermined D/A conversion.

The embodiment is characterized by an auxiliary loop for integrating the output of the delay circuit 6 and feeding back into the input side of the quantization circuit 4 wherein the data fed back from the auxiliary loop is selectively added to input of the quantization circuit 4. That is, the auxiliary loop is formed by an integrator 20 consisting of an adder 21 and a delay circuit 22, and output of the integrator 20 is fed through a switch 24 into an adder 23 located at the input side of the quantization circuit 4. Either data fed back from the quantization circuit 4 or "0" data is selected by means of the switch 24 for adding to output of the adder 10 by the adder 23. A mode setting signal supplied from an external circuit or device is used as a switching control signal for the switch 24. The switch 24 can be made of a logical gate.

Assuming that the digital data DG1 and DG2 are X and Y, that outputs of the adders 10 and 9 are A and B, and that output of the adder 5 is K, the following three expressions are true:

$$K = A - Y \quad (1)$$

$$A = B + 2K \times Z^{-1} \quad (2)$$

$$B = X - K \times Z^{-1} \quad (3)$$

When A and B are eliminated from expressions (2) and (3), the output Y with respect to the input X becomes $$Y = X - K \times (1 - Z^{-1})^2 \quad (4)$$

Assuming that quantization noise at the quantization circuit 4 is N and that output of the integrator 20 is $\alpha$, the following expression is true:

$$Y = A + N + \alpha \quad (5)$$

If $\alpha = 0$ (when the adder 23 adds "0" data), $K = -N$ from expressions (1) and (5). Therefore, expression (4) becomes $$Y = X + N \times (1 - Z^{-1})^2$$

On the other hand, if $\alpha \neq 0$ (when the adder 23 adds fedback data), $\alpha = K \times Z^{-1} \times (1 - Z^{-1})^{-1}$ because a transfer function of the integrator 23 is $(1 - Z^{-1})^{-1}$. $K = -N \times (1 - Z^{-1})$ from expressions (1) and (5). Therefore, expression (4) becomes $$Y = X + N \times (1 - Z^{-1})^3$$

Thus, if data fed back from the integrator 20 is added to output of the adder 10 by the adder 23 for feeding into the quantization circuit 4, a cubic noise shaping loop is provided; if "0" data is added for feeding into the quantization circuit 4, a quadratic noise shaping loop is provided. This enables the noise shaping loop degree to be changed in response to selection of data added to output of the adder 10 by the adder 23. A noise shaping loop of degree (1+1) can be formed by adding the auxiliary loop to the circuit shown in FIG. 4. Further, a basic noise shaping loop of degree n can be made to provide a noise shaping loop of degree (n+1).

EMBODIMENT 1-2

Figure 4:
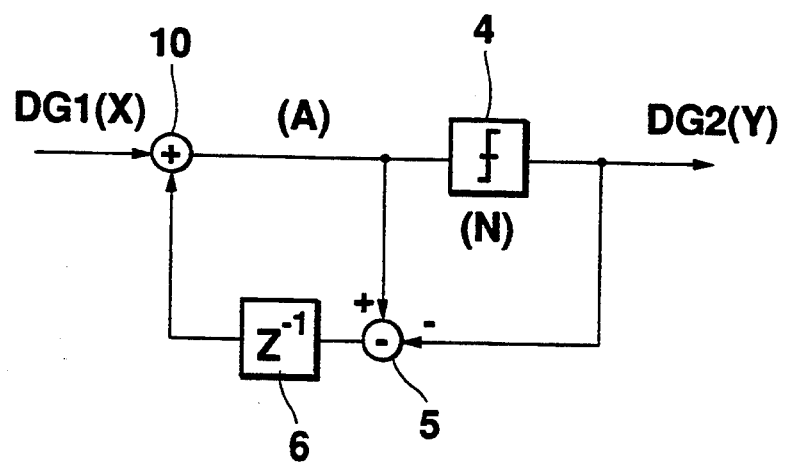
FIG. 4 is a circuit diagram of a bit compression circuit adopting a linear noise shaping loop.
Figure 6:
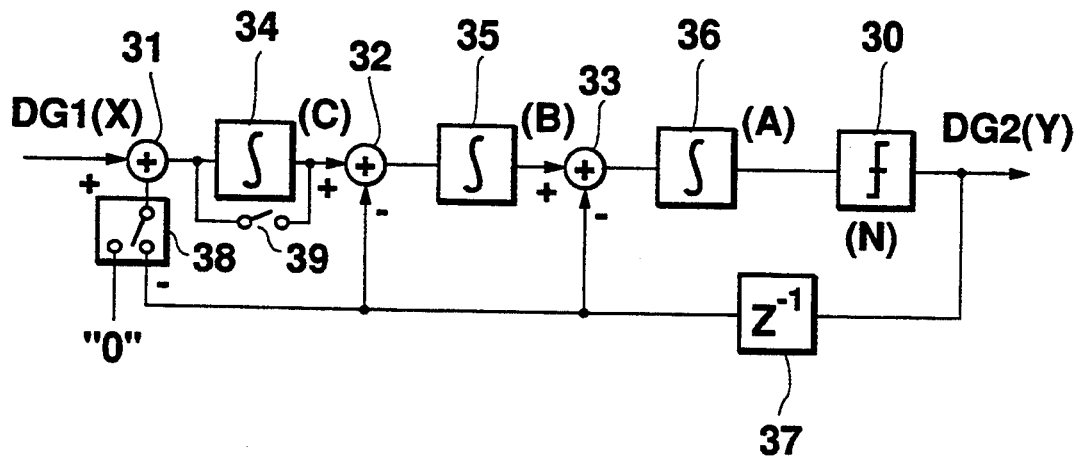
FIG. 6 is a circuit diagram of a bit compression circuit of a delta sigma D/A converter according to an embodiment 1-2 of the invention.

FIG. 6 shows a circuit diagram of a bit compression circuit adopting a noise shaping loop of degree (2+1) for use with a delta sigma type D/A converter according to another embodiment of the invention A quantization circuit 30, like the quantization circuit shown in FIG. 4, evaluates the signal level indicated by 16-bit digital data DG1 at seven stages of $\pm 3$ (from $-3$ to $\pm 3$) for compressing into 3-bit digital data DG2. Three adders 31 to 33 and integrating circuits 34 to 36 are connected alternately in series to the input side of the quantization circuit 30 so that a cubic noise shaping loop can be provided. An output signal of the quantization circuit 30 is fed into a delay circuit 37 for a delay of one sampling period, then fed into the adders 31–33. The adder 31 subtracts output of the delay circuit 37 from digital data DG1, then feeds the result into the integrator 34. Likewise, the adders 32 and 33 subtract output of the delay circuit 37 from outputs of the integrating circuits 34 and 35 respectively and feed the results into the following integrating circuits 35 and 36. Finally, output of the integrator 36 is fed into the quantization circuit 30.

Assuming that the digital data DG1 and DG2 are X and Y, that outputs of the integrating circuits 36, 35, and 34 are A, B and C, and that quantization noise at the quantization circuit 30 is N, the following four expressions are true:

$$Y = A + N \quad (6)$$

$$A = (B - Y \times Z^{-1}) \times (1 - Z^{-1})^{-1} \quad (7)$$

$$B = (C - Y \times Z^{-1}) \times (1 - Z^{-1})^{-1} \quad (8)$$

$$C = (X - Y \times Z^{-1}) \times (1 - Z^{-1})^{-1} \quad (9)$$

When A is eliminated from expressions (6) and (7), $$Y = B + N \times (1 - Z^{-1}) \quad (10)$$

When B is eliminated from expressions (10) and (8), $$Y = C + N \times (1 - Z^{-1})^2 \quad (11)$$

Further, when C is eliminated from expressions (11) and (9), the output Y with respect to the input X becomes $$Y = X + N \times (1 - Z^{-1})^3 \quad (12)$$

This indicates a cubic noise shaping operation.

If the output of the delay circuit 37 fed into the adder 31 is replaced with "0" data by switching a switch 38 and further the integrating operation of the integrator 34 is stopped by turning on a switch 39, expression (9) becomes C=X. Thus, expression (12) is not true and at the stage of expression (11), the output Y with respect to the input X becomes $$Y = X + N \times (1 - Z^{-1})^2 \quad (13)$$

This indicates a quadratic noise shaping operation. Therefore, the noise shaping loop degree can be set to quadratic or cubic by changing the input to the adder 31 and turning off or on the integrator 34.

With such a noise shaping loop, an adder and an integrator are added and the adders and integrators at each stage are selectively stopped, thereby enabling a wide selection of noise shaping loop degrees.

According to the embodiment, the noise shaping loop degree can be set as instructed from an external circuit or device, thus the conversion characteristics of the D/A converter can be changed without altering the circuit configuration. D/A converters of the same configuration can be applied to a wide range of applications for cost reduction.

EMBODIMENT 2-1

Figure 7:
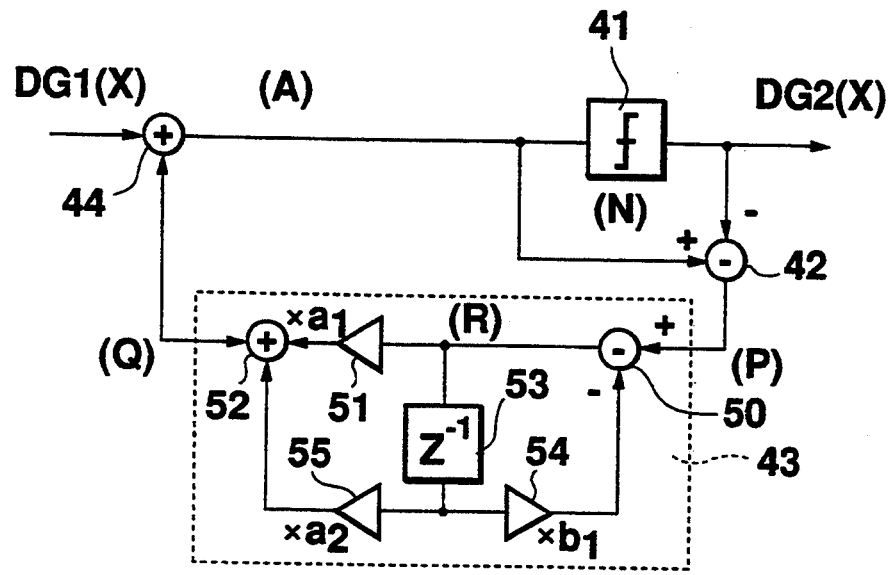
FIG. 7 is a circuit diagram of a bit compression circuit of a delta sigma D/A converter according to an embodiment 2-1 of the invention.

FIG. 7 shows a circuit diagram of a bit compression circuit adopting a noise shaping loop for use with a delta sigma type D/A converter according to another embodiment of the invention.

A quantization circuit 41 evaluates 16-bit input digital data DG1 at seven stages of ±3 and converts it into 3-bit digital data DG2 for output. The output signal together with the input signal is fed into an adder 42 which then subtracts the input data from the output data of the quantization circuit 41 for calculation of data representing quantization noise. This quantization noise data is fed back into the input side through an infinite impulse response (IIR) filter 43; the data is fed into an adder 44 receiving digital data DG1 for addition to the digital data DG1. The data provided by adding the output of the IIR filter 43 to the digital data DG1 is fed into the quantization circuit 41.

The IIR filter forming a feedback loop of a noise shaping loop of degree n is made up of n delay circuits and n adders, and is set so that its transfer characteristic becomes $$1 - (1 - Z^{-1})^n \times H(Z)^{-1} \quad (1)$$

where $H(Z) = 1 + C1 Z^{-1} + C2 Z^{-2} + \ldots + Cn Z^{-n}$

For example, to provide a linear noise shaping loop, as shown in FIG. 7, data from an adder 50 which receives input data is fed into an adder 52 on the output side through a multiplier 51 and also fed into a delay circuit 53, and output of the delay circuit 53 is fed into the adders 50 and 52 through multipliers 54 and 55 respectively. Assuming that input and output of the IIR filter 43 are P and Q respectively and that output of the adder 50 is R, the following two expressions are true:

$$Q = a1 \times R + a2 \times R \times Z^{-1}$$

$$R = P - b1 \times R \times Z^{-1}$$

where a1, b1, and a2 are multiplication factors of the multipliers 51, 54, and 55 respectively. When R is eliminated from the expressions, the following expression is true:

$$Q = P \times (a1 + a2 \times Z^{-1}) \times (1 + b1 \times Z^{-1})^{-1}$$

The transfer characteristic of the IIR filter 43 becomes $$(a1 + a2 \times Z^{-1}) \times (1 + b1 \times Z^{-1})^{-1} \quad (2)$$

The multiplication factors a1, b1, and a2 are selected so that 1−a1=1 and a2−b1=1 are set by relating the transfer characteristic shown in expression (1) to that shown in expression (2), and the transfer characteristic is set to a predetermined value. For example, if a1=0, b1=½, and a2=3/2 are set, the transfer function becomes $$3 \times Z^{-1} \times (2 + Z - 1)^{-1}$$

A transfer characteristic is provided corresponding to a linear noise shaping loop with C1=½ set with n=1 in the transfer characteristic in expression (1). Therefore, assuming that the digital data DG1 and DG2 are X and Y, that output of the adder 44 is A, and that quantization noise at the quantization circuit 41 is N, the following two expressions are true:

$$A + N = Y$$

$$X - 3 \times N \times Z^{-1} \times (2 + Z^{-1})^{-1} = A$$

When A is eliminated from these expressions, the output Y with respect to the input X is represented as $$Y = X + N \times (1 - Z^{-1}) \times (1 + Z^{-1}/2)^{-1}$$

EMBODIMENT 2-2

Figure 8:
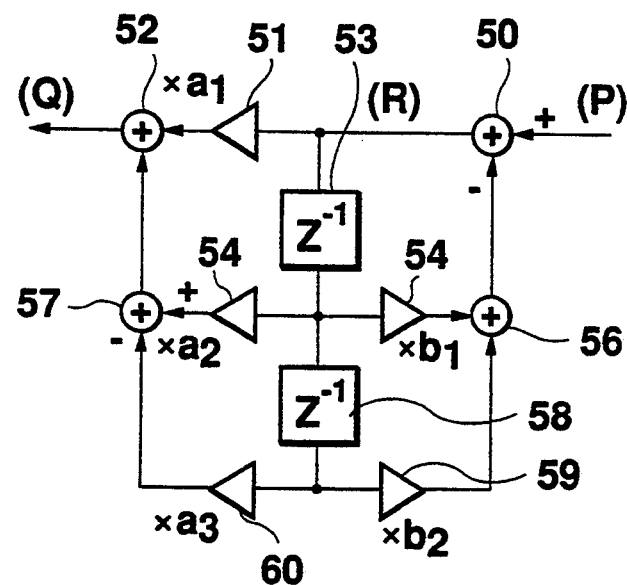
FIG. 8 is a circuit diagram of an IIR filter corresponding to a quadratic noise shaping loop according to an embodiment 2-2 of the invention.

To provide a quadratic noise shaping loop, as shown in FIG. 8, adders 56 and 57, a delay circuit 58, and multipliers 59 and 60 are added to the IIR filter 43 to cover a linear noise shaping loop; output of a delay circuit 58 which receives output of a delay circuit 53 is fed through the multiplier 59 into the adder 56 which then adds it to output of a multiplier 54, and is also fed through the multiplier 60 into the adder 57 which then subtracts it from output of a multiplier 55. As with the IIR filter in FIG. 7, assuming that input to an adder 50 is P, that output from an adder 52 is Q, and that output from the adder 50 is R, the following two expressions are true:

$$Q = a1 \times R + a2 \times R \times Z^{-1} - a3 \times R \times Z^{-2}$$

$$R = P - b1 \times R \times Z^{-1} - b2 \times R \times Z^{-2}$$

where b2 and a3 are multiplication factors of the multipliers 59 and 60 respectively. When R is eliminated from the expressions, the following expression is true:

$$Q = P \times (a1 + a2 \times Z^{-1} - a3 \times Z^{-2}) \times (1 + b1 \times Z^{-1} + b2 \times Z^{\times 2})^{-1}$$

Therefore, the transfer characteristic becomes $$(a1 + a2 \times Z^{-1} - a3 \times Z^{-2}) \times (1 + b1 \times Z^{-1} + b2 \times Z^{-2})^{-1} \quad (3)$$

If the transfer characteristic shown in expression (1) is related to that shown in expression (3) and the constants are set to a1=0, b1=½, a2=5/2, b2=¼, and a3=¾ so that 1−a1=1, a2−b1=2, and a3+b2=1 are set, $$(10 \times Z^{-1} - 3 \times Z^{-2}) \times (4 + 2 \times Z^{-1} + Z^{-2})^{-1}$$

Thus, transfer characteristic is provided corresponding to a quadratic noise shaping loop with C1=½ and C2=¼ set with n=2 in the transfer characteristic in expression (1). As with the linear noise shaping loop, assuming that the digital data DG1 and DG2 are X and Y, that output of the adder 44 is A, and that quantization noise at the quantization circuit 41 is N, the following two expressions are true:

$$A + N = Y$$

$$X + N \times (10 \times Z^{-1} - 3 \times Z^{-2}) \times (4 + 2 \times Z^{-1} + Z^{-2})^{-1} = A$$

If A is eliminated from these expressions, the output Y with respect to the input X becomes $$Y = X + N \times (1 - Z^{-1})^2 \times (1 + Z^{-1}/2 + Z^{-2}/4)^{-1}$$

In the embodiments, linear and quadratic noise shaping loops are shown. A cubic or higher-degree noise shaping loop can also be formed by adding an adder, a delay circuit, and a multiplier to the IIR filter in sequence. At that time, assuming that the digital data DG1 and DG2 are X and Y, that output of the adder 44 is A, and that quantization noise at the quantization circuit 41 is N, the following two expressions are true in a noise shaping loop of degree n:

$$A + N = Y$$

$$X + N \times (1 - Z^{-1})^n \times H(Z)^{-1} - N = A$$

The output Y with respect to the input X is represented as $$Y = X + N \times (1 - Z^{-1})^n \times H(Z)^{-1}$$

According to the embodiments, a feedback loop of a noise shaping loop can be made of an infinite impulse response (IIR) filter to reduce a noise constituent without raising the noise shaping loop degree, thus occurrence of quantization noise can be suppressed at the same time as the bias of a noise constituent to a high frequency band is reduced. Therefore, even if small quantization steps are set at a quantization circuit, a noise shaping loop can be operated stably and distortion in the high frequency band can be suppressed.

What is claimed is:

1. A bit compression circuit for decreasing the number of bits of digital data used for a delta sigma type D/A converter which converts input digital data into analog signals, said bit compression circuit comprising:

a quantization circuit which samples input digital data represented by a predetermined number of bits fed during a digital data input period on a sampling period shorter than the digital data input period and converts the sampled data into quantized digital data having a fewer number of bits than the input digital data;

a first adder for calculating quantization noise data generated during quantization from the difference between the input data and output data of said quantization circuit;

a first delay circuit which delays the quantization noise data output by said first adder for said sampling period for outputting delayed quantization noise data;

a second adder which adds the quantization noise data delayed for said sampling period which is output by said delay circuit and digital data fed into said quantization circuit;

an integrator into which said delayed quantization noise data is fed for integrating the same; and selective addition means for selectively adding output of said integrator to data fed into said quantization circuit.

2. The bit compression circuit as claimed in claim 1 wherein said selective addition means comprises:

a third adder disposed on an output side of said quantization circuit; and selection means for determining whether or not output from said integrator is to be fed into said third adder.

3. The bit compression circuit as claimed in claim 2 wherein said selection means is a switch for selecting the output from said integrator or a "0" signal for output.

4. The bit compression circuit as claimed in claim 1 wherein said integrator comprises:

an adder for the integrator into which the delayed quantization noise data is fed; and a delay circuit for the integrator for delaying output of said adder for the integrator for said sampling period and feeding it back into said adder for the integrator.

5. The bit compression circuit as claimed in claim 1 further including:

a first multiplier for multiplying the delayed quantization noise data supplied to said second adder by a predetermined coefficient;

an additional delay circuit for further delaying said delayed quantization noise data for said sampling period; and an additional adder for subtracting output from said additional delay circuit from said input digital data.

6. A bit compression circuit used for a delta sigma type D/A converter which converts input digital data into analog signals, said bit compression circuit comprising:

a quantization circuit which samples input digital data represented by a predetermined number of bits fed during a digital data input period on a sampling period shorter than the digital data input period and converts the Sampled data into quantized digital data having a fewer number of bits than the input digital data;

a first delay circuit which delays the quantized digital data output by said quantization circuit for said sampling period for outputting delayed quantized data;

a first adder disposed on an input path to said quantization circuit for subtracting said delayed quantized data from input digital data;

a first integrator disposed between said first adder and said quantization circuit for integrating output of said first adder and supplying the result to said quantization circuit;

a second adder disposed on an input side of said first adder for subtracting said delayed quantized data from input data;

a second integrator disposed between said second adder and said first adder for integrating output of said second adder and supplying the result to said first adder;

first selection means disposed on an input path of said quantized data to said second adder for controlling supply of said quantized data to said second adder; and second selection means for controlling integrating operation of said second integrator, said selection means for determining whether or not the integrating result output from said second integrator is to be supplied to said first adder, input data of said second integrator being supplied to said first adder as it is if the integrating result is not supplied to said first adder.

7. The bit compression circuit as claimed in claim 6 wherein said first selection means is a switch for selecting said delayed quantized data or "0" for output; and said second selection means is a switch disposed on a bypass of said second integrator.

8. The bit compression circuit as claimed in claim 6 further including:

a third adder disposed between said second integrator and said first adder for subtracting said delayed quantized data from output data of said first adder; and a third integrator disposed between said third adder and said first adder for integrating output of said third adder and supplying the result to said first adder.

9. A bit compression circuit used for a delta sigma type D/A converter which converts input digital data into analog signals, said bit compression circuit comprising:

a quantization circuit which samples input digital data represented by a predetermined number of bits fed during a digital data input period on a sampling period shorter than the digital data input period and converts the sampled data into quantized digital data having a fewer number of bits than the input digital data;

a first adder for calculating quantization noise data generated during quantization from the difference between the input data and output data of said quantization circuit;

an infinite impulse response filter for filtering the quantization noise data output by said first adder; and a second adder which adds output of said infinite impulse response filter to data input to said quantization circuit.

10. The bit compression circuit as claimed in claim 9 wherein said infinite impulse response filter comprises:

a third adder into which the quantization noise data is fed from said first adder;

a first delay circuit which delays output of said third adder for said sampling period;

a first multiplier which multiplies output of said first delay circuit by a predetermined coefficient for feeding back the result into said third adder;

a second multiplier which multiplies output of said third adder by a predetermined coefficient;

a third multiplier which multiplies output of said first delay circuit by a predetermined coefficient; and a fourth adder which adds output of said second multiplier and output of said third multiplier.

11. The bit compression circuit as claimed in claim 10 wherein said infinite impulse response filter further includes:

a second delay circuit into which output of said first delay circuit is fed for further delaying it for said sampling period;

fourth and fifth multipliers, each of which multiplies output of said second delay circuit by a predetermined coefficient;

fifth adder disposed between said first multiplier and said third adder for adding output of said first multiplier and output of said fourth multiplier; and sixth adder disposed between said third multiplier and said fourth adder for adding output of said third multiplier and output of said fifth multiplier.

* * * * *